United States Patent
Ptasienski et al.

(10) Patent No.: US 7,132,628 B2
(45) Date of Patent: Nov. 7, 2006

(54) VARIABLE WATT DENSITY LAYERED HEATER

(75) Inventors: Kevin Ptasienski, O'Fallon, MO (US); James McMillin, Algonquin, IL (US); Thomas T. Nagl, St. Louis, MO (US); Rolando O. Juliano, Hannibal, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 0 days.

(21) Appl. No.: 10/797,259

(22) Filed: Mar. 10, 2004

(65) Prior Publication Data

US 2005/0199610 A1    Sep. 15, 2005

(51) Int. Cl.
 *H05B 3/16* (2006.01)
(52) U.S. Cl. .............. 219/543; 219/424; 219/538; 219/219; 219/552
(58) Field of Classification Search ........... 219/212, 219/444.1, 538, 543, 553, 549, 424, 552, 219/219; 338/314, 99; 29/620; 428/433; 385/147
 See application file for complete search history.

(56) References Cited

U.S. PATENT DOCUMENTS

| | | | | |
|---|---|---|---|---|
| 2,629,166 A | * | 2/1953 | Marsten et al. | 29/620 |
| 3,010,850 A | * | 11/1961 | Colbert et al. | 428/433 |
| 3,851,150 A | * | 11/1974 | Von Holzen | 219/553 |
| 4,196,411 A | * | 4/1980 | Kaufman | 338/314 |
| 4,734,563 A | | 3/1988 | Lloyd | |
| 4,764,665 A | | 8/1988 | Orban et al. | |
| 4,882,466 A | * | 11/1989 | Friel | 219/219 |
| 5,087,804 A | * | 2/1992 | McGaffigan | 219/618 |
| 5,424,767 A | * | 6/1995 | Alavizadeh et al. | 347/17 |
| 5,444,228 A | * | 8/1995 | Gelus | 219/549 |
| 5,504,307 A | | 4/1996 | Hayashi et al. | |
| 5,665,262 A | * | 9/1997 | Hajaligol et al. | 219/553 |
| 5,742,223 A | * | 4/1998 | Simendinger et al. | 338/21 |
| 5,808,178 A | | 9/1998 | Rounbehler et al. | |
| 5,866,194 A | | 2/1999 | Ogawa et al. | |
| 5,973,296 A | * | 10/1999 | Juliano et al. | 219/424 |
| 6,575,729 B1 | | 6/2003 | Godwin et al. | |
| 6,602,345 B1 | | 8/2003 | Schupp et al. | |
| 2003/0231415 A1 | * | 12/2003 | Puerto | 359/883 |
| 2005/0141845 A1 | * | 6/2005 | Mori et al. | 385/147 |

FOREIGN PATENT DOCUMENTS

| | | |
|---|---|---|
| DE | 3334744 | 4/1984 |
| EP | 1021064 | 7/2000 |
| JP | 8213202 | * 8/1996 |

* cited by examiner

*Primary Examiner*—Robin O. Evans
*Assistant Examiner*—Leonid Fastovsky
(74) *Attorney, Agent, or Firm*—Harness, Dickey & Pieerce P.L.C.

(57) ABSTRACT

A layered heater is provided with a resistive layer having a resistive circuit pattern, the resistive circuit pattern defining a length and a thickness, wherein the thickness varies along the length of the resistive circuit pattern for a variable watt density. The present invention also provides layered heaters having a resistive circuit pattern with a variable thickness along with a variable width and/or spacing of the resistive circuit pattern in order to produce a variable watt density. Methods are also provided wherein the variable thickness is achieved by varying a dispensing rate of a conductive ink used to form the resistive circuit pattern, varying the feed rate of a target surface relative to the dispensing of the ink, and overwriting a volume of conductive ink on top of a previously formed trace of the resistive circuit pattern.

11 Claims, 14 Drawing Sheets

(SEC. A-A)

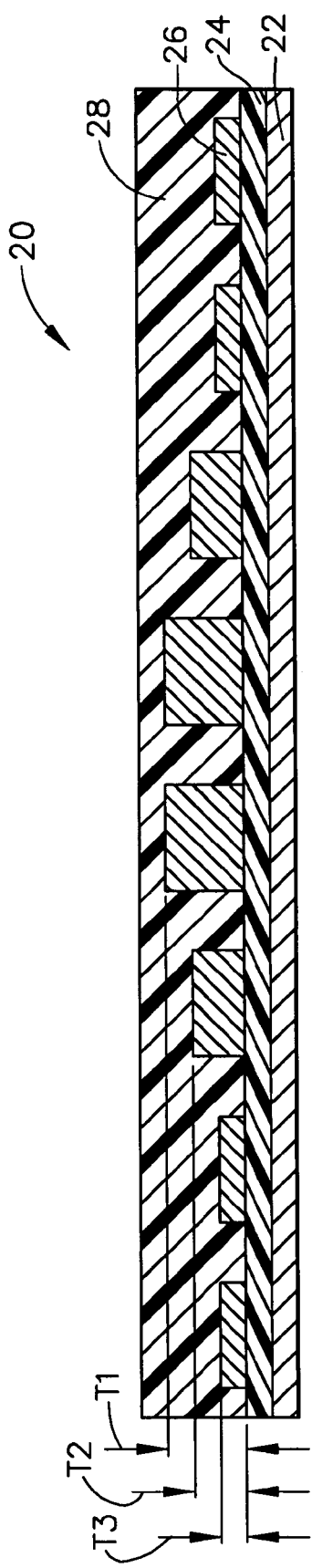
FIG. 4 (SEC. A-A)
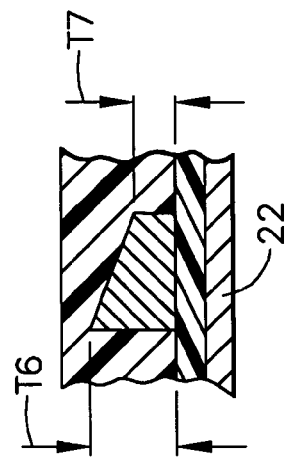
FIG. 7
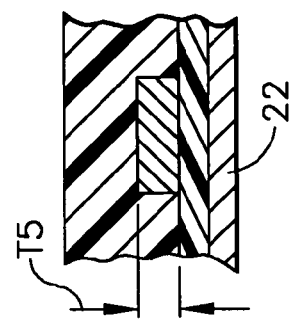
FIG. 6
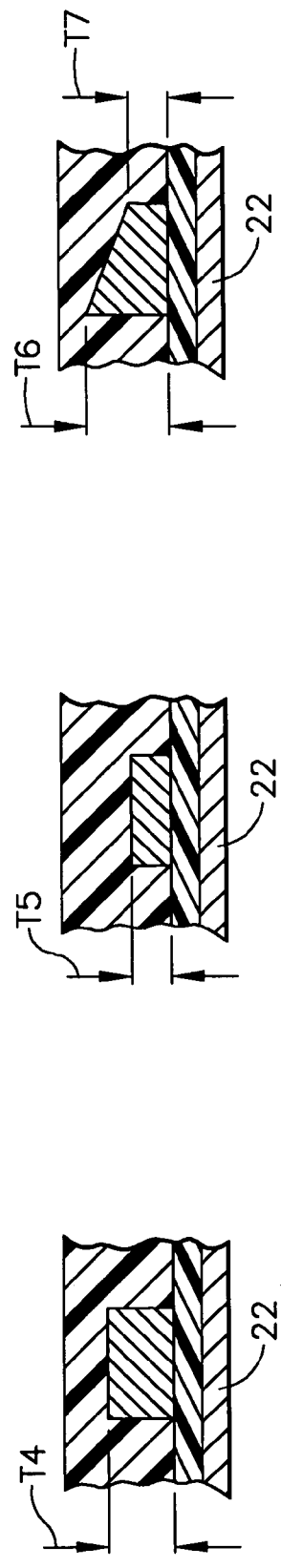
FIG. 5

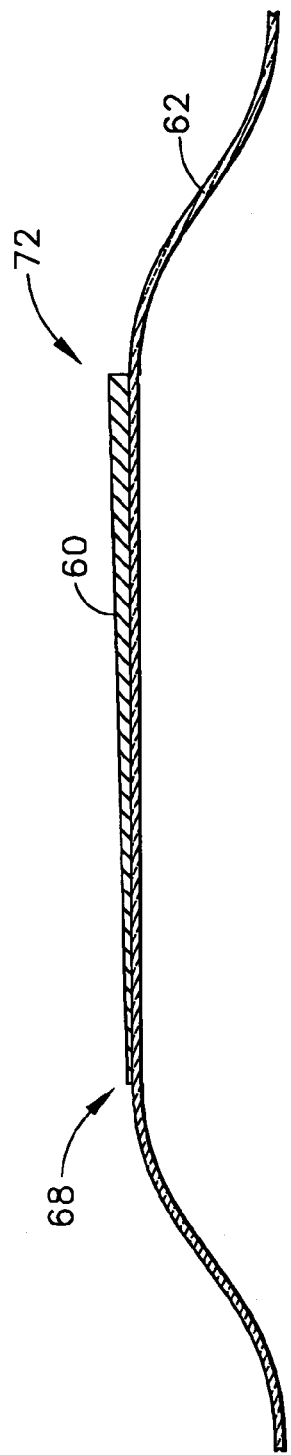
FIG. 17 (SEC. G-G)
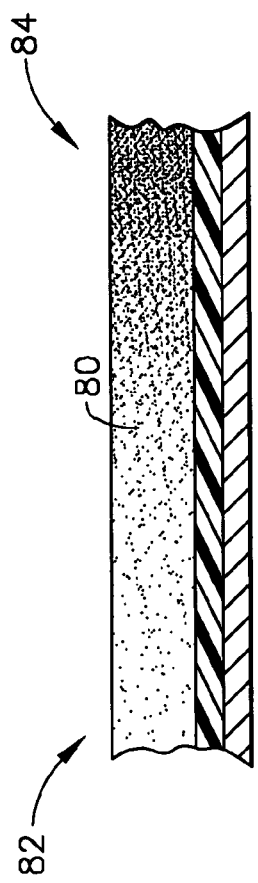
FIG. 18

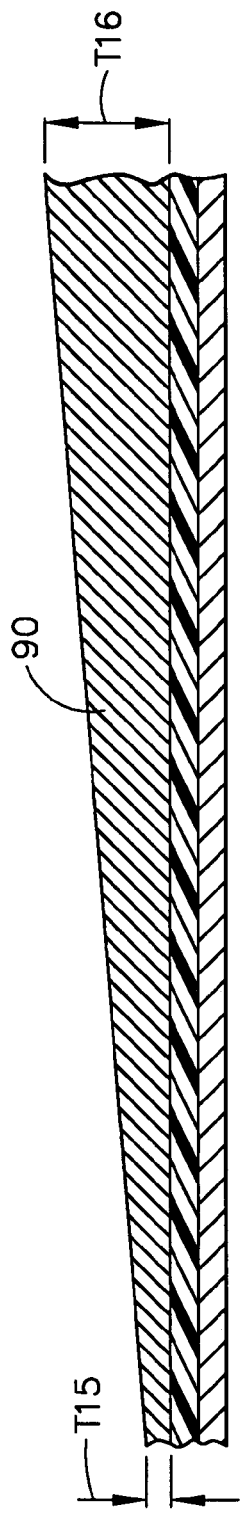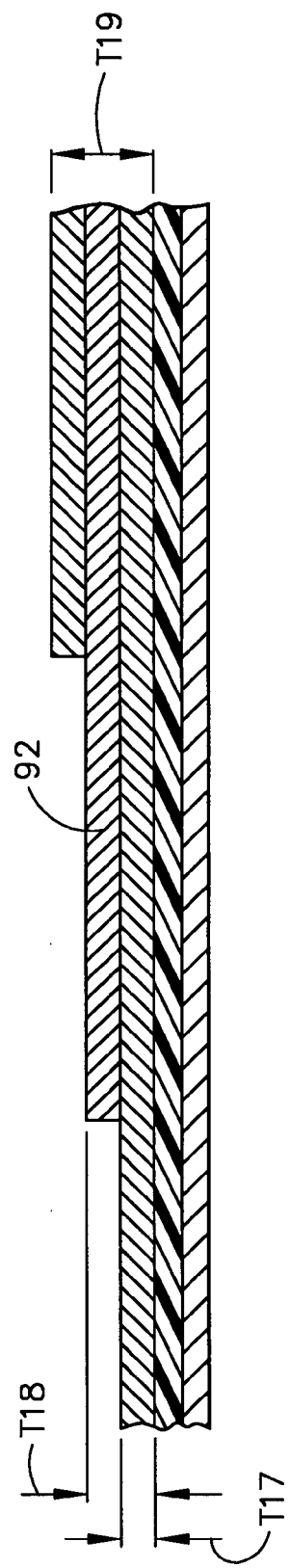
FIG. 19a
FIG. 19b

VARIABLE WATT DENSITY LAYERED HEATER

FIELD OF THE INVENTION

The present invention relates generally to electrical heaters and more particularly to devices for and methods of distributing the watt density of electrical heaters.

BACKGROUND OF THE INVENTION

Layered heaters are typically used in applications where space is limited, when heat output needs vary across a surface, where rapid thermal response is desirous, or in ultra-clean applications where moisture or other contaminants can migrate into conventional heaters. A layered heater generally comprises layers of different materials, namely, a dielectric and a resistive material, which are applied to a substrate. The dielectric material is applied first to the substrate and provides electrical isolation between the substrate and the electrically-live resistive material and also reduces current leakage to ground during operation. The resistive material is applied to the dielectric material in a predetermined pattern and provides a resistive heater circuit. The layered heater also includes leads that connect the resistive heater circuit to an electrical power source, which is typically cycled by a temperature controller. The lead-to-resistive circuit interface is also typically protected both mechanically and electrically from extraneous contact by providing strain relief and electrical isolation through a protective layer. Accordingly, layered heaters are highly customizable for a variety of heating applications.

Layered heaters may be "thick" film, "thin" film, or "thermally sprayed," among others, wherein the primary difference between these types of layered heaters is the method in which the layers are formed. For example, the layers for thick film heaters are typically formed using processes such as screen printing, decal application, or film dispensing heads, among others. The layers for thin film heaters are typically formed using deposition processes such as ion plating, sputtering, chemical vapor deposition (CVD), and physical vapor deposition (PVD), among others. Yet another series of processes distinct from thin and thick film techniques are those known as thermal spraying processes, which may include by way of example flame spraying, plasma spraying, wire arc spraying, and HVOF (High Velocity Oxygen Fuel), among others.

In some electrical heater applications, it may be desirable to vary the watt density of the heater in certain areas in order to tailor the amount of heat delivered to the specific part or device being heated or to account for inherent variations in heat distribution along the heater trace or element. Known electrical heaters typically vary the spacing of the resistive circuit pattern such that where the spacing is smaller and the trace of the resistive circuit pattern is closer, the watt density is higher, for a series circuit configuration. Conversely, the larger the spacing between the traces of the resistive circuit pattern, the lower the watt density in those regions. In other known electrical heaters, the width of the trace of the resistive circuit pattern is varied along its length in order to vary the watt density, wherein the wider the trace the lower the watt density and the narrower the trace the higher the watt density, again, for a series circuit configuration.

SUMMARY OF THE INVENTION

In one preferred form, the present invention provides a layered heater comprising at least one resistive layer comprising a resistive circuit pattern, wherein the resistive circuit pattern defines a length and a thickness. The thickness of the resistive circuit pattern varies along the length of the resistive circuit pattern for a variable watt density. In other forms, both the thickness and a width of the resistive circuit pattern are varied, the thickness and a spacing are varied, or the thickness and the width and the spacing are varied for a variable watt density.

In another form, a layered heater is provided that comprises a dielectric layer, a resistive layer formed on the dielectric layer, and a protective layer formed on the resistive layer. The resistive layer comprises a resistive circuit pattern, and the resistive circuit pattern defines a length and a thickness, wherein the thickness of the resistive circuit pattern varies along the length of the resistive circuit pattern for a variable watt density. In another form, the dielectric layer is formed on a substrate.

In yet another form, a resistive circuit pattern for use in a layered heater is provided, wherein the resistive circuit pattern defines a length and a variable thickness along the length of the resistive circuit pattern.

According to methods of the present invention, resistive circuit patterns of a layered heater are formed through the steps of dispensing a conductive ink at a rate onto a surface and varying the dispensing rate of the conductive ink to form a variable thickness resistive circuit pattern. In another method, a feed speed of the surface relative to the dispensing of conductive ink is varied to form a variable thickness resistive circuit pattern. Additionally, a method that varies the dispensing rate and varies the feed speed of the surface relative to the dispensing of conductive ink is provided in another form of the present invention.

Yet another method is provided that forms a resistive circuit pattern of a layered heater through the steps of applying a volume of conductive ink onto a substrate to form a trace and applying an additional volume of conductive ink onto the trace, wherein a variable thickness resistive circuit pattern is produced.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 4 is a cross-sectional view, taken along line A—A of FIG. 3 and rotated 90°, of a layered heater system with a resistive circuit pattern having a variable thickness in accordance with the principles of the present invention;

FIG. 5 is a cross-sectional view, taken along line B—B of FIG. 3, of a layered heater system with a resistive circuit pattern having a variable thickness in accordance with the principles of the present invention;

FIG. 6 is a cross-sectional view, taken along line C—C of FIG. 3 and rotated 90°, of a layered heater system with a resistive circuit pattern having a variable thickness in accordance with the principles of the present invention;

FIG. 7 is a cross-sectional view, taken along line D—D of FIG. 3 and rotated 90°, of a layered heater system with a resistive circuit pattern having a variable thickness across a width in accordance with the principles of the present invention;

FIG. 17 is an enlarged cross-sectional view, taken along line G—G of FIG. 16 and rotated 90°, of a variable watt density resistive circuit pattern in accordance with the principles of the present invention;

FIG. 18 is a cross-sectional view along the length of a constant thickness resistive circuit pattern having variable watt density in accordance with the principles of the present invention;

FIG. 19a is a cross-sectional view along the length of a continuous resistive circuit pattern in accordance with the principles of the present invention;

FIG. 19b is a cross-sectional view along the length of a non-continuous resistive circuit pattern in accordance with the principles of the present invention;

Corresponding reference numerals indicate corresponding parts throughout the several views of the drawings.

DETAILED DESCRIPTION OF THE PREFERRED EMBODIMENTS

The following description of the preferred embodiments is merely exemplary in nature and is in no way intended to limit the invention, its application, or uses.

Figure 1:
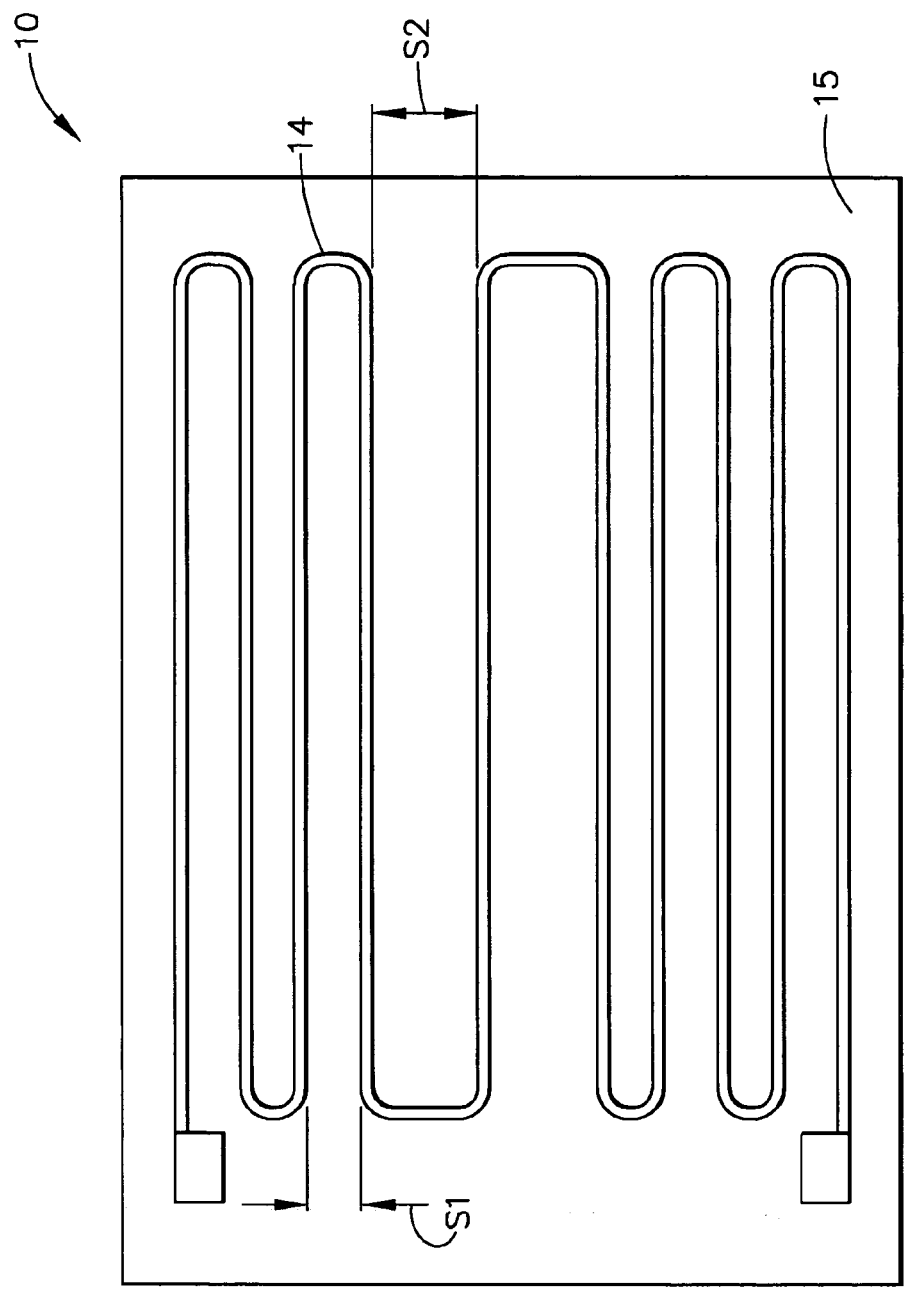
FIG. 1 is a plan view of a layered heater system with a resistive circuit pattern having variable spacing in accordance with a prior art heater system.
Figure 2:
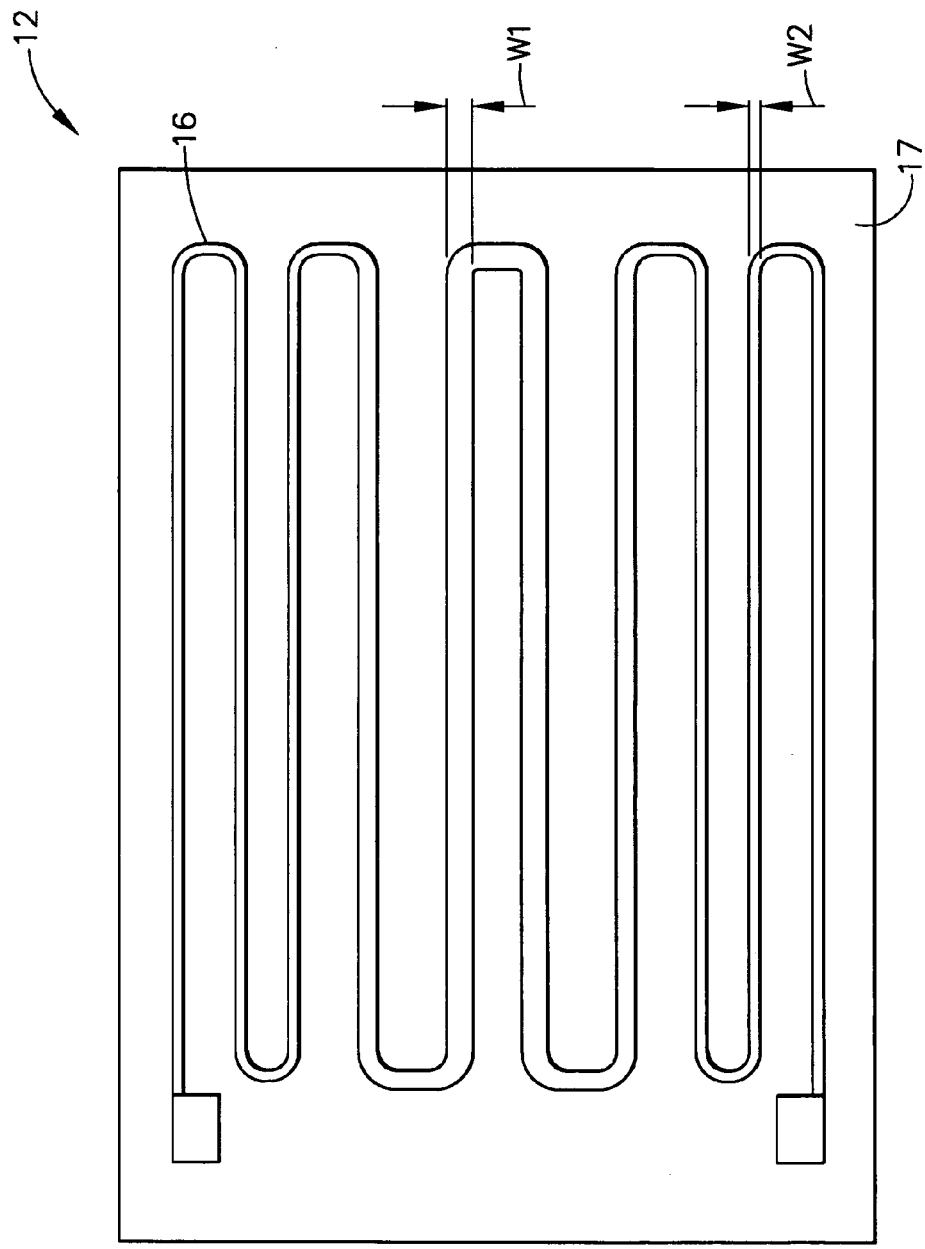
FIG. 2 is a plan view of a layered heater system with a resistive circuit pattern having variable width in accordance with a prior art heater system.

Referring to FIGS. 1 and 2, two (2) prior art heater systems 10 and 12 are illustrated that provide variable watt density. Both of the prior art heater systems 10 and 12 comprise resistive circuit patterns, 14 and 16 respectively, which provide the requisite heating to the part or device to be heated. Generally, the resistive circuit pattern 14 in FIG. 1 is formed on a substrate 15 and comprises a variable spacing (e.g., S1 and S2) as shown in order to provide a variable watt density as required. In the areas of S1, the spacing is closer and thus the watt density is higher. Conversely, in the areas of S2, the spacing is wider and thus the watt density is lower.

As further shown in FIG. 2, the resistive circuit pattern 16 is formed on a substrate 17 and comprises a variable width (e.g., W1 and W2) in order to provide a variable watt density as required. In the areas of W1, the width is greater and thus the watt density is lower, whereas in the areas of W2, the width is narrower and the watt density is higher. Accordingly, these prior art heater systems 10 and 12 employ a variable spacing or a variable width in order to vary the watt density as required.

More specifically, the watt density is a result of both a trace watt density, which is the watt density along the length or trace of the resistive circuit pattern (14, 16), and a substrate watt density, which is the amount of coverage, or percent of the total substrate surface area that is covered by the resistive circuit pattern (14, 16), of the resistive circuit pattern (14, 16) across the entire substrate (15, 17). The trace watt density comprises the power being dissipated as a function of the individual trace area, which, as used herein is generally defined by the width times the overall length of the resistive trace. The substrate watt density comprises the power being dissipated along the resistive circuit pattern (14, 16) and the power being dissipated as a function of the amount of coverage that the resistive circuit pattern (14, 16) provides over the substrate (15, 17). Thus, the trace watt density in FIG. 1 is constant across the entire substrate 15 since the width of the resistive circuit pattern 14 is constant. However, since the spacing of the resistive circuit pattern 14 is variable, the amount of coverage of the resistive circuit pattern 14 over the substrate 15 varies, which results in a variable watt density. In FIG. 2, the trace watt density varies since the width of the resistive circuit pattern 14 varies, while the amount of coverage of the resistive circuit pattern 16 over the substrate 17 remains constant, which results in a variable watt density. Therefore, a variable watt density is achieved through a variable trace watt density and/or a variable coverage of the resistive circuit pattern (14, 16)

over the substrate (15, 17). Accordingly, as used herein the term "watt density" should be construed to include either trace watt density or substrate watt density. As used herein, the term "coverage" should be construed to mean the total area of the resistive circuit pattern as compared with, or as a percentage of, the total area of a substrate. Accordingly, the higher the total area of the resistive circuit pattern over a given substrate area, the higher the "coverage."

Figure 3:
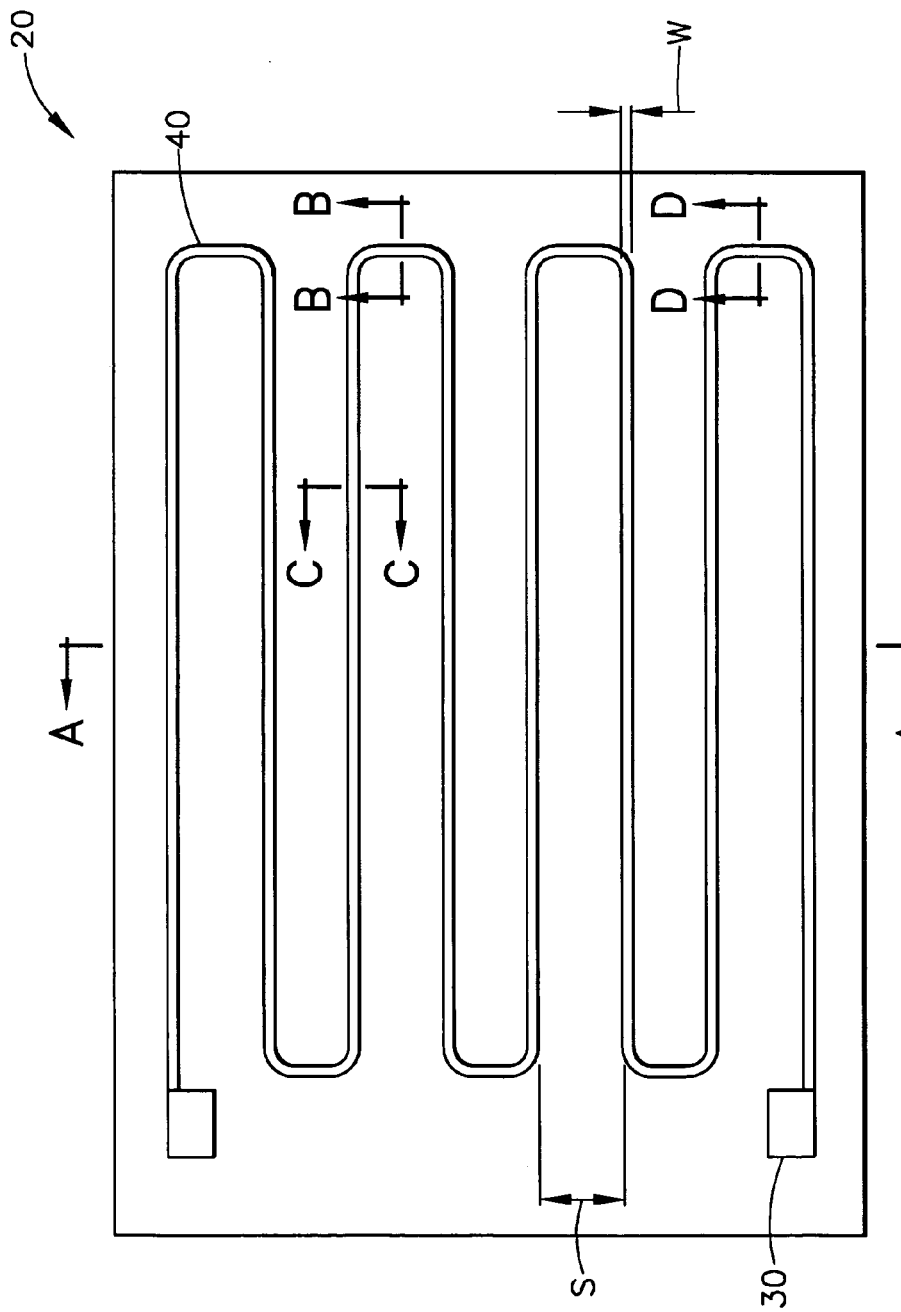
FIG. 3 is a plan view of a layered heater system constructed in accordance with the principles of the present invention.

Referring now to FIGS. 3 and 4, a layered heater that provides enhanced design flexibility to achieve variable watt density in accordance with the present invention is illustrated and generally indicated by reference numeral 20. Generally, the layered heater 20 comprises a number of layers disposed on a substrate 22, wherein the substrate 22 may be a separate element disposed proximate the part or device to be heated, or the substrate 22 may be the part or device itself. As best shown in FIG. 4, the layers preferably comprise a dielectric layer 24, a resistive layer 26, and a protective layer 28. The dielectric layer 24 provides electrical isolation between the substrate 22 and the resistive layer 26 and is formed on the substrate 22 in a thickness commensurate with the power output, applied voltage, intended application temperature, or combinations thereof, of the layered heater 20. The resistive layer 26 is formed on the dielectric layer 24 and provides a heater circuit for the layered heater 20, thereby providing the heat to the substrate 22. The protective layer 28 is formed on the resistive layer 26 and is preferably an insulator, however other materials such as an electrically or thermally conductive material may also be employed according to the requirements of a specific heating application while remaining within the scope of the present invention.

As further shown, terminal pads 30 are preferably disposed on the dielectric layer 24 and are in contact with the resistive layer 26. Accordingly, electrical leads (not shown) are in contact with the terminal pads 30 and connect the resistive layer 26 to a power source (not shown). As further shown, the protective layer 28 is formed on the resistive layer 26 and is preferably a dielectric material for electrical isolation and protection of the resistive layer 26 from the operating environment. Additionally, the protective layer 28 may cover a portion of the terminal pads 30 so long as there remains sufficient area to promote an electrical connection with the power source.

As used herein, the term "layered heater" should be construed to include heaters that comprise at least one functional layer (e.g., dielectric layer 24, resistive layer 26, and protective layer 28, among others), wherein the layer is formed through application or accumulation of a material to a substrate or another layer using processes associated with thick film, thin film, thermal spraying, or sol-gel, among others. These processes are also referred to as "layered processes," "layering processes," or "layered heater processes." Such processes and functional layers are described in greater detail in co-pending application titled "Combined Layering Technologies for Electric Heaters," filed on Jan. 6, 2004, which is commonly assigned with the present application and the contents of which are incorporated herein by reference in their entirety.

As further shown in FIG. 3, the resistive layer 26 defines a resistive circuit pattern 40, which comprises a length (shown as the distance along the resistive circuit pattern 40 between the terminal pads 30), a width W, and a spacing S. As illustrated in FIG. 4, the resistive circuit pattern 40 further comprises a variable thickness along the length L as shown by way of example in the areas having a thickness T1, thickness T2, and thickness T3. As shown, thickness T1 is greater than thickness T2, and thickness T2 is greater than T3. In this example, a higher watt density is required in the area of T3 versus the areas of T2 and T1, and a higher watt density is required in the area of T2 than T1, generally due to heat loss through the edges of the substrate 22 for a typical heater application. Accordingly, the thickness of the resistive circuit pattern 40 is thinner in areas where a higher watt density is required (higher resistance, greater heat transfer) and thicker in areas where a lower watt density is required (lower resistance, less heat transfer) during operation of the layered heater 20. Therefore, as the thickness varies along the length of the resistive circuit pattern 40, the resistance of the resistive circuit pattern 40 is varied along its length, which results in a variable trace watt density. Methods for producing the variable thickness resistive circuit pattern 40 are described in greater detail below.

Referring now to FIGS. 5 and 6, a thickness T4 is shown through a curved or "racetrack" portion of the resistive circuit pattern 40, which is thicker than an adjacent area having a thickness T5 along a linear portion of the resistive circuit pattern 40. This racetrack portion has traditionally included a wider resistive circuit pattern due to the inherent build-up of current or "current crowding" in these areas during operation. The "current crowding" will result in high trace watt density in the region adjacent the inner portion of the racetrack, leading to a higher operating temperature and subsequent reliability degradation. To maintain a constant voltage, the pattern in prior art heaters has been designed to be wider to reduce the resistance where a current increase occurs. Unfortunately, this wider racetrack consumes additional space and to some degree dictates the spacing between the resistive circuit pattern 40 along the linear portions. The present invention overcomes this disadvantage by increasing the thickness T4 along the racetrack portion rather than increasing the width of the resistive circuit pattern 40 such that additional space is not consumed and a more compact resistive circuit pattern 40 is provided.

In another form of the present invention as shown in FIG. 7, the resistive circuit pattern 40 comprises a variable thickness across the width of the racetrack portion. Along the inner portion of the racetrack where current crowding more specifically occurs, the resistive circuit pattern 40 comprises a thickness T6, which is thicker and has less resistance than the outer portion of the racetrack that comprises a thickness T7. As a result, the inner portion of the racetrack at T6 has a lower watt density than the outer portion of the racetrack at T7 in order to accommodate the current crowding, which promotes a more uniform temperature throughout the entire racetrack portion. Therefore, the thickness varies across the width of the resistive circuit pattern 40 from T6 to T7 in order to provide a variable watt density. It should be understood that the specific application of a variable thickness across the width of the resistive circuit pattern 40 for a racetrack configuration is not intended to limit the scope of the present invention. The variable thickness across the width as illustrated and described herein may be applied in any application where such variable watt density is desired while remaining within the teachinqs of the present invention.

Figure 8:
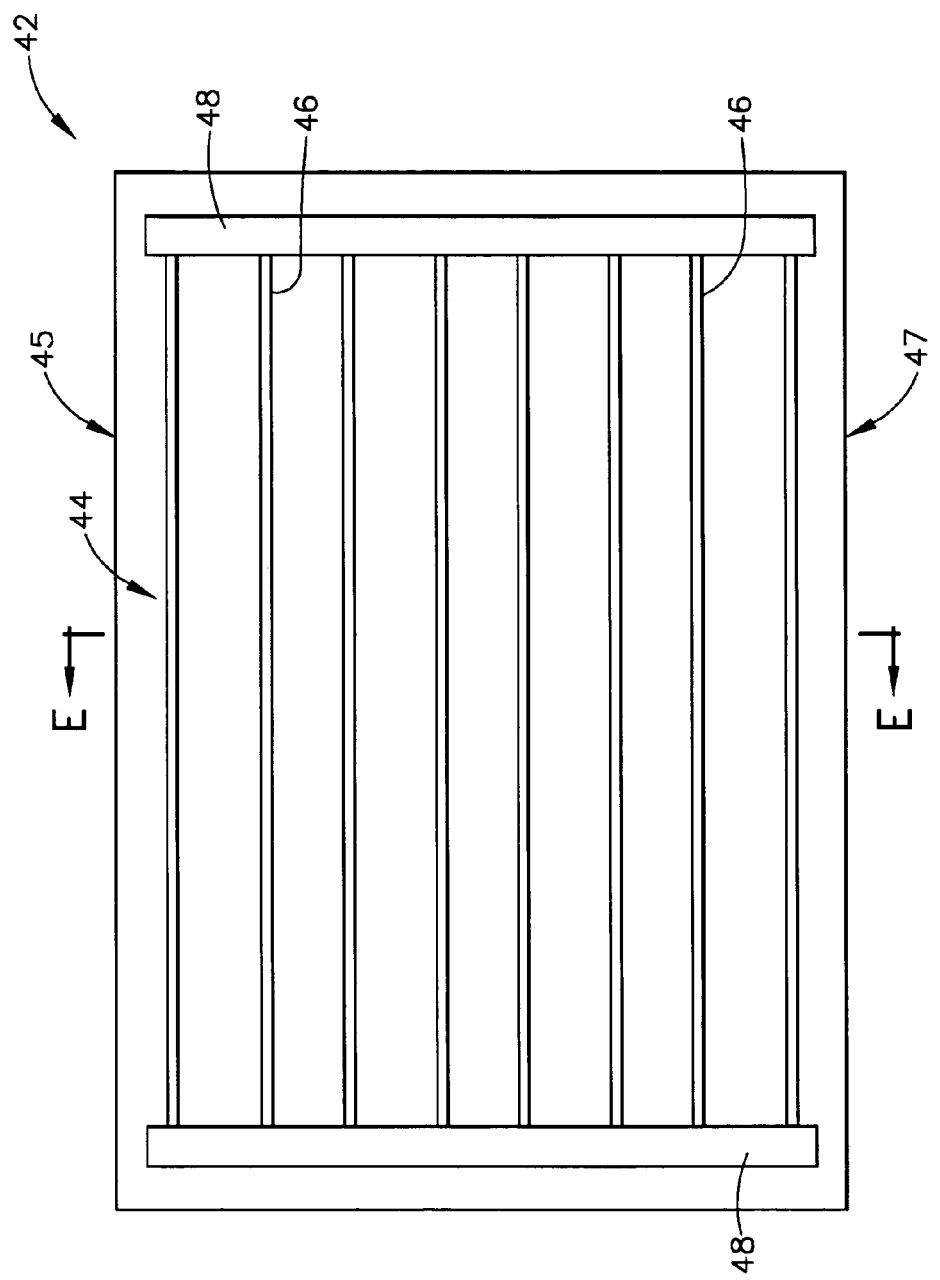
FIG. 8 is a plan view of another embodiment of a layered heater system having a parallel circuit configuration and constructed in accordance with the principles of the present invention.
Figure 9:
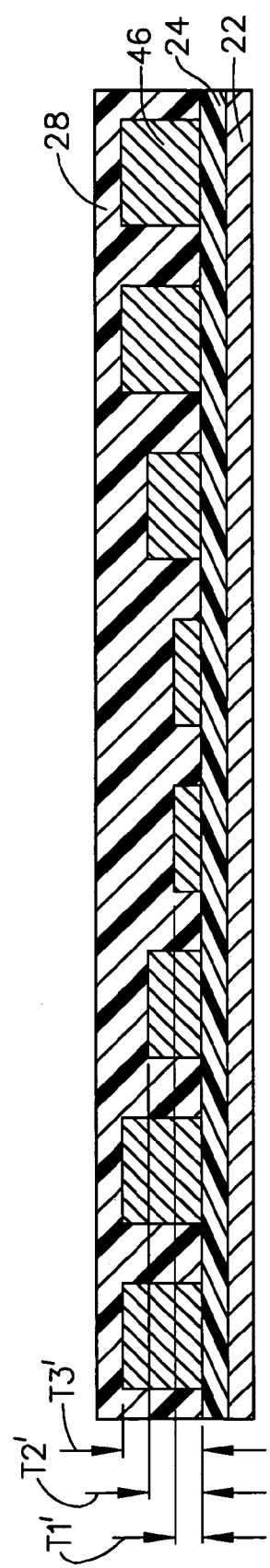
FIG. 9 is a cross-sectional view, taken along line E—E of FIG. 8 and rotated 90°, of a layered heater system with a parallel resistive circuit pattern having a variable thickness in accordance with the principles of the present invention.

Referring to FIGS. 8 and 9, bariable thickness according to another form of the present invention is employed in a parallel circuit configuration of a layered heater 42, rather than a series circuit configuration as previously described. As shown, a resistive circuti pattern 44 comprises a series of resistive traces 46 that are connected to power busses 48. In a parallel circuit, assuming a constant voltage, the current in each resistive trace 46 is a function of the resistance and is not constant as with the series circuit illustrated above. Since the power is equal to the square of the current times the resistance, ($P=I^2R$), an increase in power is best achieved by an increase in current, which is accomplished through an increase in thickness of the corresponding resistive trace 46. Therefore, in a similar application as described above where a higher watt density is required near the edges 45 and 47 of the substrate 22, thickness T1' is less than thickness T2', and thickness T2' is less than T3'. Accordingly, the thickness of the resistive circuit pattern 44 is thicker in areas where a higher watt density is required and thinner in areas where a lower watt density is required during operation of the layered heater 42 in a parallel circuit. Therefore, as the thickness varies in each resistive trace 46 of the resistive circuit pattern 44, the current varies within each resistive trace 46, which results in a variable trace watt density across the substrate 22 (i.e., variable substrate watt density).

Figure 10:
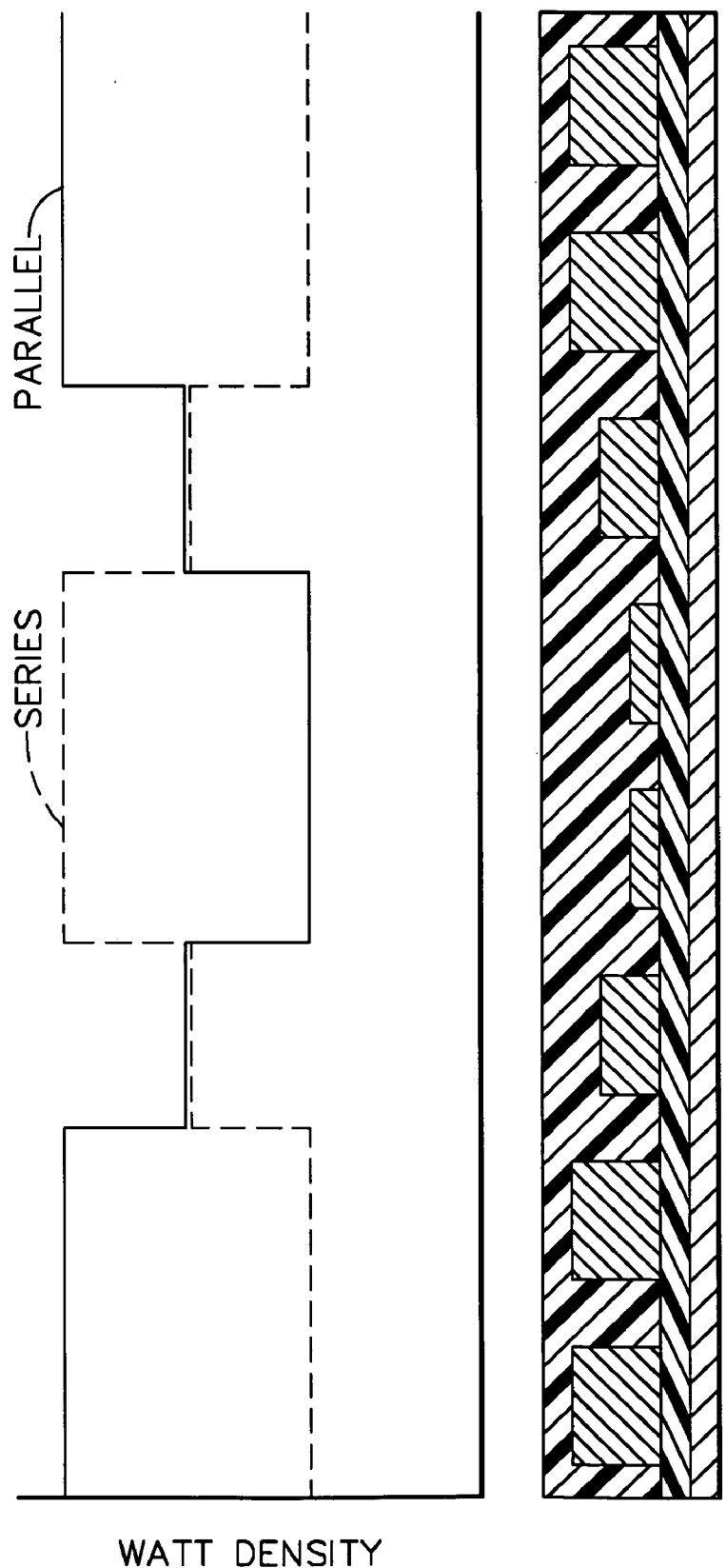
FIG. 10 is a cross-sectional view of resistive traces illustrating the different watt densities for a series circuit configuration versus a parallel circuit configuration in accordance with the principles of the present invention.

Therefore, depending on whether the resistive circuit pattern comprises a series or a parallel circuit configuration, the thickness of the resistive trace varies differently. As illustrated in FIG. 10, for a parallel circuit configuration, the thickness of the resistive trace is thicker in areas where a higher watt density is required and thinner where a lower watt density is required. Conversely, for a series circuit configuration, the thickness of the resistive trace is thicker where a lower watt density is required and thinner where a higher watt density is required. Accordingly, the circuit configuration, whether series or parallel, dictates whether the thickness should be increased or decreased according to watt density requirements of the specific application.

Figure 11:
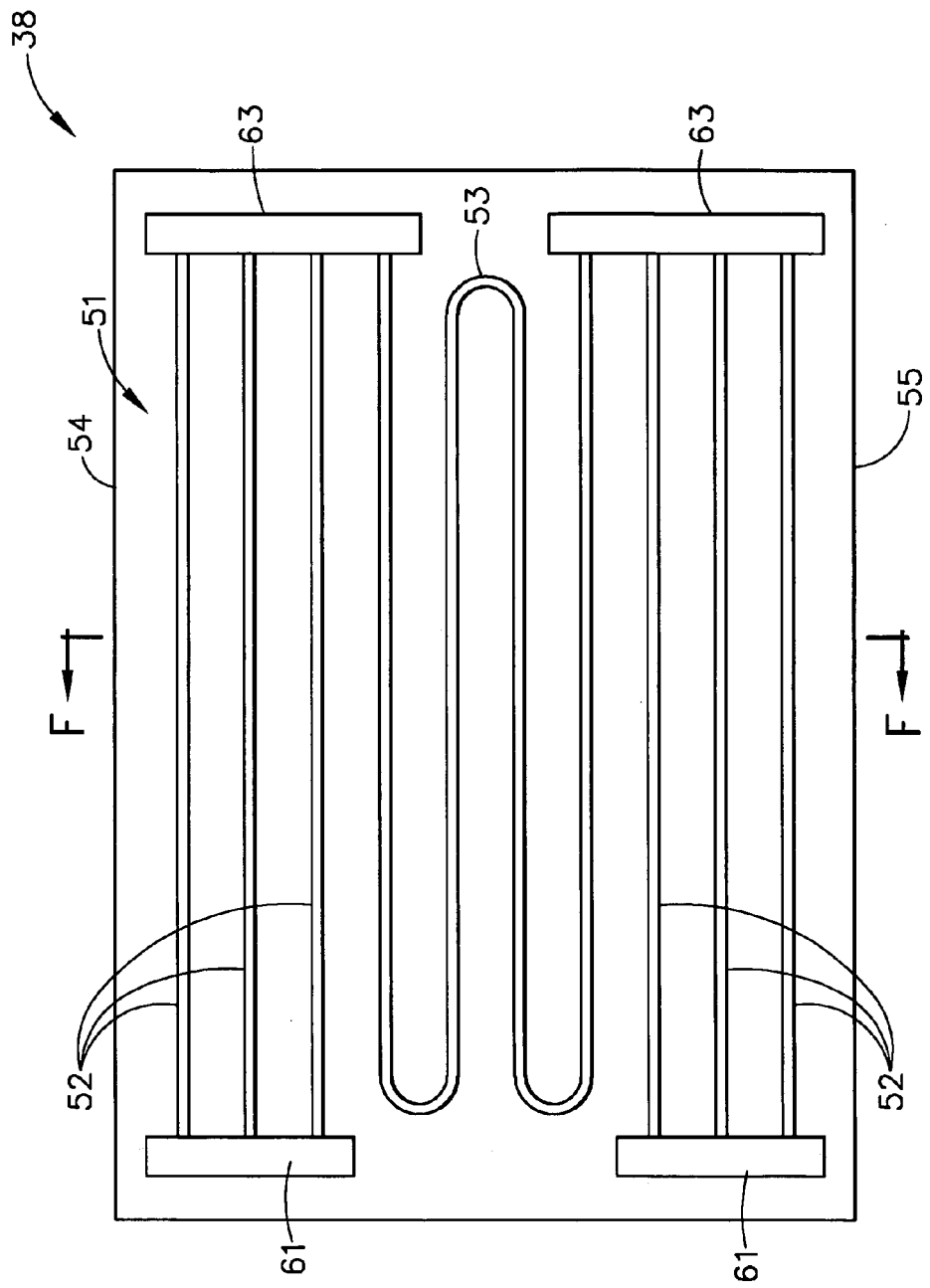
FIG. 11 is a plan view of yet another embodiment of a layered heater system having a parallel-series-parallel circuit configuration and constructed in accordance with the principles of the present invention.
Figure 12:
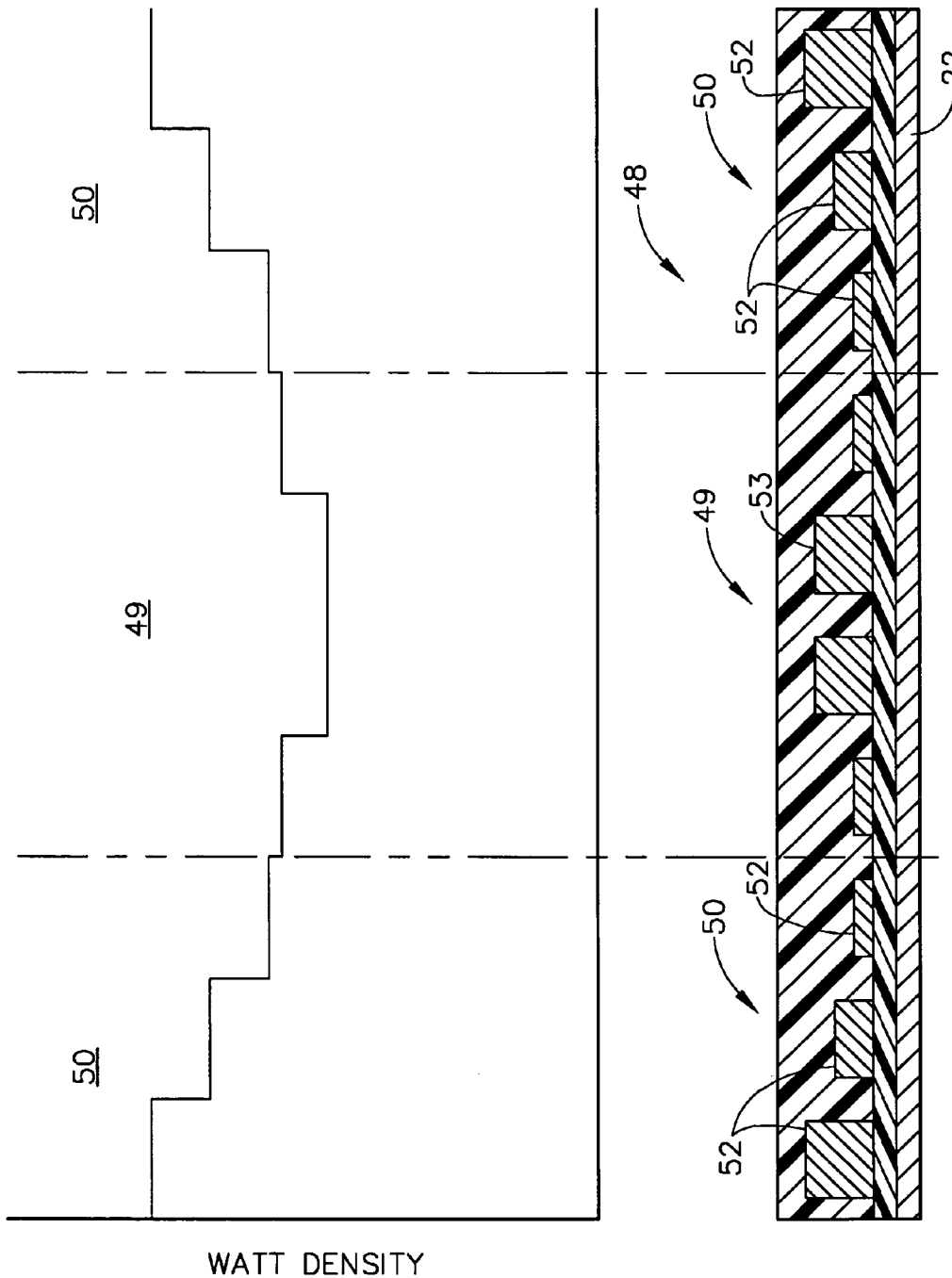
FIG. 12 is a cross-sectional view, taken along line F—F of FIG. 11 and rotated 90°, of a layered heater system with a parallel-series-parallel resistive circuit pattern, with a superimposed plot of watt density, having a variable thickness in accordance with the principles of the present invention.

In addition to the individual series and parallel circuits as described above, another form of the present invention comprises a parallel-series-parallel circuit as illustrated in FIGS. 11 and 12, wherein a layered heater 48 comprises a series circuit 49 in parallel with parallel circuits 50. As shown, a resistive circuit pattern 51 comprises parallel traces 52 and a series trace 53, which are connected through power terminals 61 and power busses 63. In an application where a higher watt density is required near edges 54 and 55 of the substrate 22, the thickness of the resistive circuit pattern 51 near the edges within the parallel traces 52 is thicker for a higher watt density, and the thickness of the resistive circuit pattern 51 within the series trace 53 is also thicker for a lower watt density. Accordingly, both parallel and series circuits may be combined with the variable thickness according to the teachings of the present invention to achieve the desired distribution of watt density. Therefore, the term "series-parallel" or "parallel-series" should be construed to mean a circuit that includes one or more series and parallel circuits within the same power circuit, regardless of the order of each of the series and parallel circuits within the power circuit.

As further shown in FIG. 12, a plot of the watt density across the substrate 22 is superimposed above the parallel traces 52 and the series trace 53 to further illustrate the different effect of variable thickness based on the type of circuit, i.e., parallel or series. As the thickness decreases across the parallel traces 52, the watt density correspondingly decreases, however, as the thickness increases across the series trace 53, the watt density continues to decrease. Therefore, the magnitude and direction (i.e., increase or decrease in thickness) of variable thickness according to the teachings of the present invention depends on the circuit configuration and the desired watt density across the substrate 22.

Figure 13:
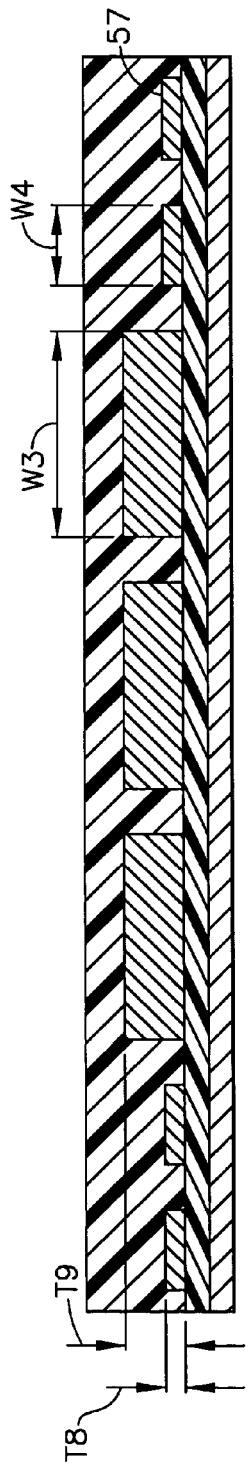
FIG. 13 is a cross-sectional view of a layered heater system with a resistive circuit pattern having a variable thickness and a variable width in accordance with the principles of the present invention.

In addition to varying the thickness of the resistive circuit pattern 40, the width and/or the spacing may also be varied for additional design flexibility in achieving a desired distribution of watt density across and along the substrate. Accordingly, FIG. 13 illustrates a resistive circuit pattern 57 having both a variable thickness (T8 and T9) and a variable width (W3 and W4), with a constant spacing in a series circuit configuration. In the areas of T8 and W4, the resistive circuit pattern 57 is relatively thin and narrow, whereas in the areas of T9 and W3, the resistive circuit pattern 57 is relatively thick and wide. As a result, a higher watt density is provided in the areas of T8 and W4, and a lower watt density is provided in the areas of T9 and W3.

Figure 14:
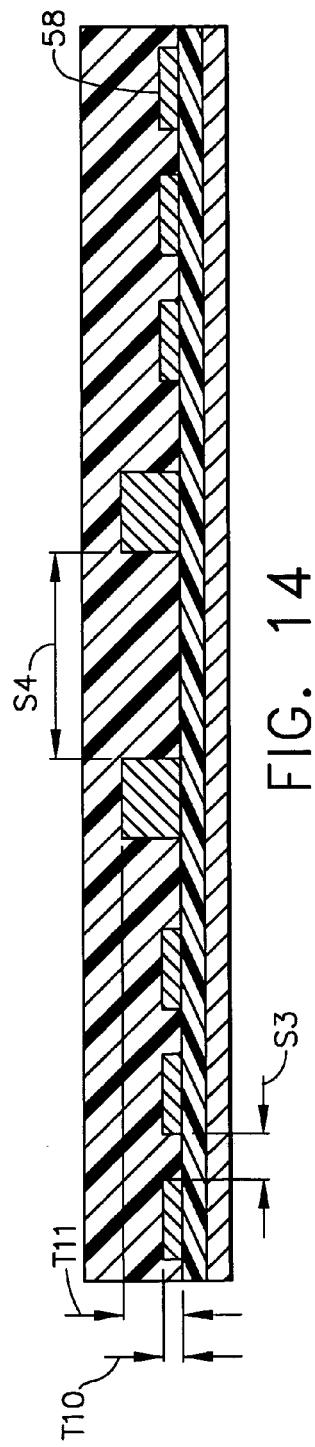
FIG. 14 is a cross-sectional view of a layered heater system with a resistive circuit pattern having a variable thickness and a variable spacing in accordance with the principles of the present invention.

Referring to FIG. 14, a resistive circuit pattern 58 is illustrated in another form of the present invention comprising both a variable thickness (T10 and T11) and a variable spacing (S3 and S4), with a constant width in a series circuit configuration. As shown, in the areas of T10 and S3, the resistive circuit pattern 58 is relatively thin and has closer spacing, whereas in the areas of T11 and S4, the resistive circuit pattern 58 is relatively thick and has wider spacing. As a result, a higher watt density is provided in the areas of T10 and S3, and a lower watt density is provided in the areas of T11 and S4.

Figure 15:
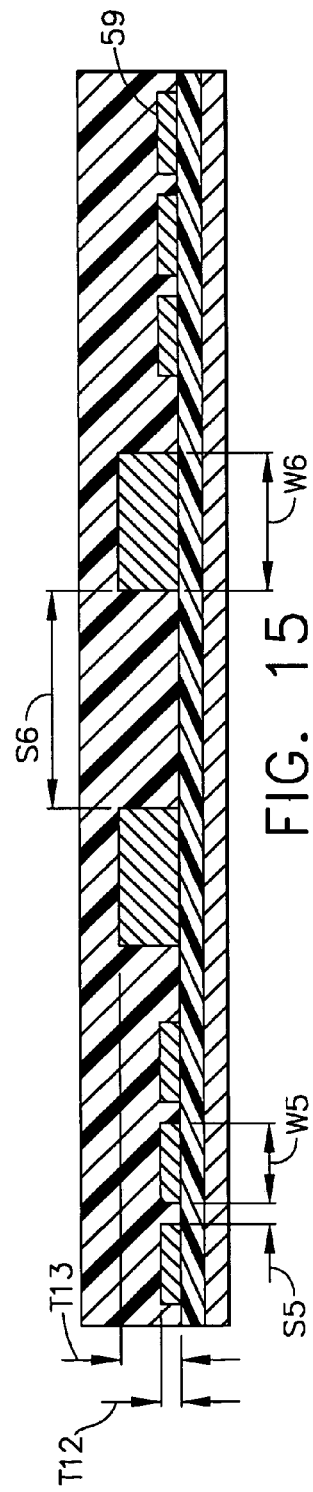
FIG. 15 is a cross-sectional view of a layered heater system with a resistive circuit pattern having a variable thickness, a variable width, and a variable spacing in accordance with the principles of the present invention.

Yet another form of the present invention is illustrated in FIG. 15, wherein a resistive circuit pattern 59 comprises a variable thickness (T12 and T13), a variable width (W5 and W6), and a variable spacing (S5 and S6) in a series circuit configuration. In the areas of T12, W5, and S5, the resistive circuit pattern 59 is relatively thin, narrow, and has closer spacing. In the areas of T13, W6, and S6, the resistive circuit pattern 59 is relatively thick, wide, and has wider spacing. Thus, a higher watt density is provided in the areas of T12, W5, and S5, whereas a lower watt density is provided in the areas of T13, W6, and S6. It should be understood that the combinations of a variable thickness and a variable width, a variable thickness and a variable spacing, and a variable thickness, a variable width, and a variable spacing as described herein may also be applied in a parallel circuit configuration or a series-parallel circuit configuration while remaining within the scope of the present invention.

Figure 16:
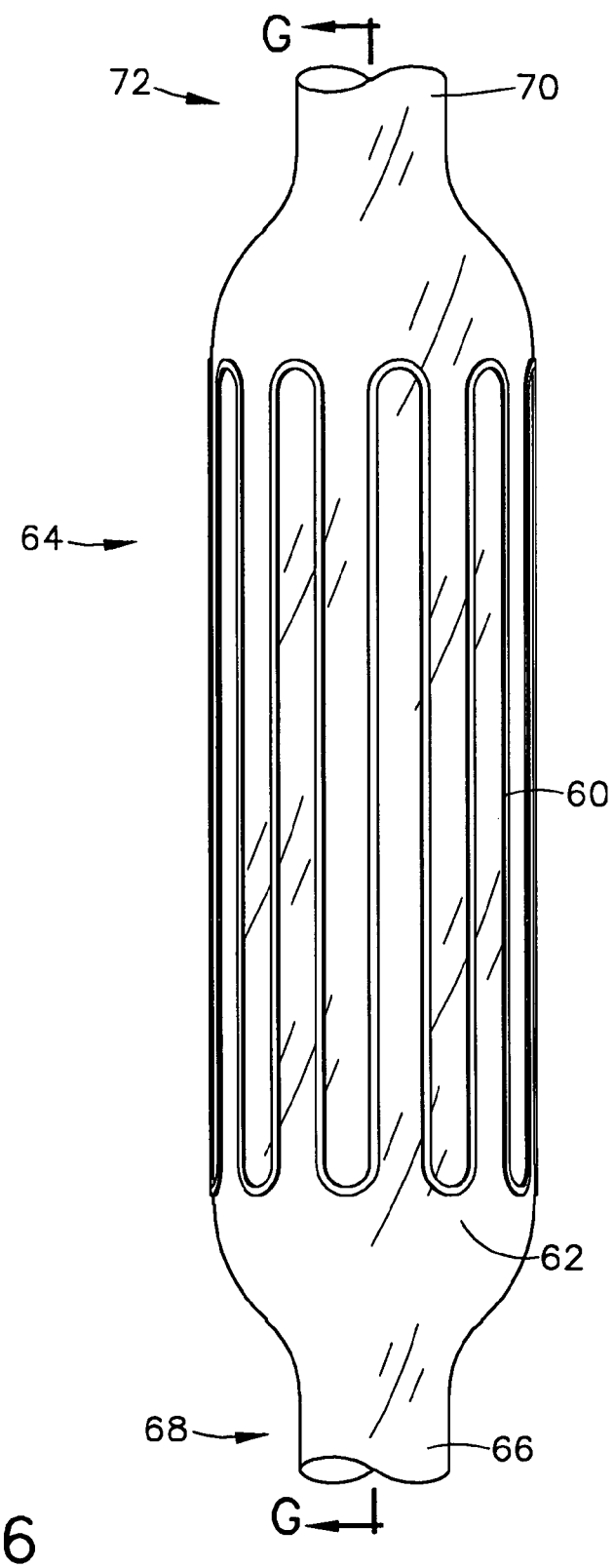
FIG. 16 is an elevated side view of a high coverage resistive circuit pattern in accordance with the principles of the present invention.

FIG. 16 illustrates another form of the present invention, wherein a resistive circuit pattern 60 has a relatively high amount of coverage over the substrate 62. Such an application may exist where the size of the substrate 62 is limited due to a relatively small target part or device being heated, or where space is limited for the layered heater within the specific application. An example of an application where high watt density is required in a relatively compact size is a quartz tube heater in chemical applications, which is illustrated and generally indicated by reference numeral 64. Generally, a chemical solution enters an inlet port 66 at a proximal end 68, flows through the quartz tube heater 64 to be heated, and then flows through an outlet port 70 at a distal end 72. Thus, the chemical solution is at a lower temperature at the inlet port 66 than it is at the outlet port 70, which results in a relatively wide temperature distribution through the quartz tube heater 64. To create a more uniform temperature distribution, the watt density at the proximal end 68 should be higher than the watt density at the distal end 72. However, since the coverage of the resistive circuit pattern 60 is relatively high, there is little to no room to tailor the spacing or the width of the resistive circuit pattern 60. Therefore, the thickness of the resistive circuit pattern 60 is thinner at the proximal end 68 and is thicker at the distal end 72 in accordance with one form of the present invention as shown in FIG. 17, which results in a variable watt density resistive circuit pattern 60.

In addition to a variable thickness and other variable geometries as previously described, another form of the present invention provides a variable watt density through a change in composition of the resistive circuit pattern material along its length. As shown in FIG. 18, a resistive circuit pattern 80 defines a constant thickness T14 along its length. However, the material composition of the resistive circuit pattern 80 changes along its length, for example, transitioning from a higher resistance composition at portion 82 and a lower resistance composition at portion 84. As a result, the watt density is higher at portion 82 than the watt density at portion 84, resulting in a variable watt density resistive circuit pattern 80. Therefore, varying the material composition of the resistive circuit pattern 80 provides additional design flexibility in providing a variable watt density layered heater in accordance with another form of the present invention. It should be understood that such a variation in material composition may be combined with the variable thickness and other variable geometries while remaining within the scope of the present invention.

In yet another form of the present invention, the variable thickness and other geometries as previously described may be either continuous as shown in FIG. 19a or non-continuous as shown in FIG. 19b. A continuous resistive circuit pattern 90, which is formed by processes that are described in greater detail below, defines a gradual change in thickness from T15 to T16. As a result, a gradual decrease in watt density occurs along the length of the resistive circuit pattern 90 from T15 to T16. Alternately, a non-continuous resistive circuit pattern 92 may be produced that defines a step change in thickness from T17 to T18 to T19. Accordingly, a step change in the watt density from high to low results along the length of the resistive circuit pattern 92 from T17 to T19. Processes for the non-continuous resistive circuit pattern 92 are also described in greater detail below. These continuous and non-continuous configurations may be applied to not only to the thickness as illustrated herein, but also to the width of the resistive circuit patterns while remaining within the scope of the present invention.

Figure 20:
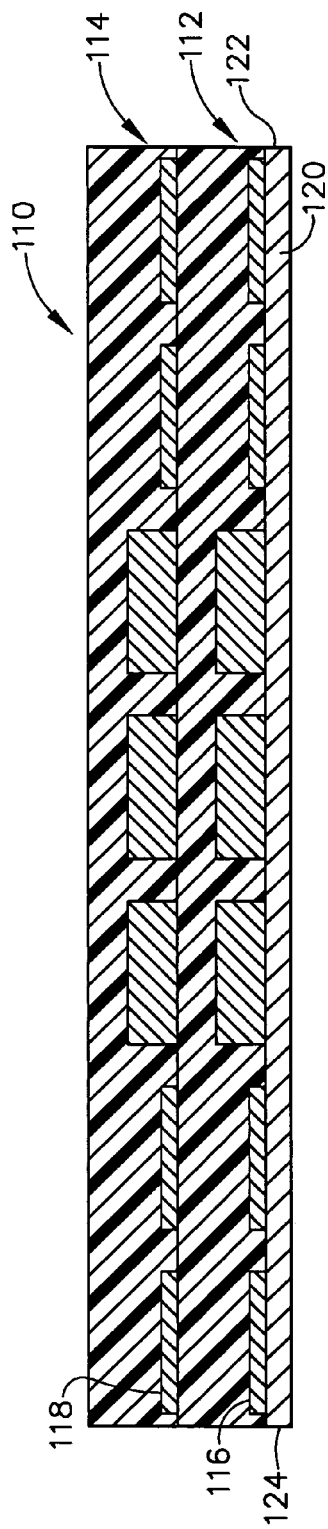
FIG. 20 is a cross-sectional view of a layered heater system with a plurality of resistive layers, wherein the resistive layers comprise resistive circuit patterns that have a variable thickness in accordance with the principles of the present invention.

Referring to FIG. 20, another form of the present invention includes a layered heater 110 that comprises a plurality of resistive layers 112 and 114, wherein each of the resistive layers 112 and 114 defines at least one resistive circuit pattern with variable thickness resistive traces 116 and 118, respectively. For the purposes of this embodiment, the circuit configuration is series, although it should be understood that parallel and/or series-parallel circuit configurations may also be employed within the plurality of resistive layers. Accordingly, in applications where the substrate 120 defines an insufficient surface area to accommodate a resistive circuit pattern to produce the required watt density on a single layer, a plurality of resistive circuit patterns are employed in a plurality of layers as shown. Additionally, the thickness is varied as shown according to watt density requirements, wherein a higher watt density is required near edges 122 and 124 of the substrate 120. Therefore, variable thickness according to the teachings of the present invention is employed within multiple resistive layers to provide the required watt density when the substrate surface area is limited. It should also be understood that the thickness may vary across the width in addition to along the length as shown and that a variable width and/or spacing may also be employed while remaining within the scope of the present invention.

Furthermore, it should be understood that the thicknesses of the resistive circuit patterns as shown and described herein are varied according to specific heater application requirements and the embodiments illustrated above are exemplary only and should not be construed as limiting the scope of the present invention. Accordingly, different patterns with different areas and configurations of varying thicknesses, along with varying width and/or spacing, within series and/or parallel circuits, and disposed within a plurality of resistive layers, among other configurations, may be also employed while remaining within the scope of the present invention.

According to one method of the present invention, the variable watt density resistive circuit patterns as described herein are formed by varying the rate at which an electrically conductive ink is dispensed onto a surface, e.g., onto the dielectric layer 24. The conductive ink may be dispensed using precision pen writing equipment, which is described in greater detail in U.S. Pat. No. 5,973,296 and commonly assigned with the present application, the contents of which are incorporated herein by reference in its entirety. With the precision pen writing equipment, the conductive ink is dispensed through an orifice in a writing tip while the tip and/or the target substrate is translated in order to produce a predetermined resistive circuit pattern. In order to achieve a variable thickness where desired, the rate at which the conductive ink is dispensed, or the flow rate of the electrically conductive ink through the tip orifice, is varied. For example, in areas where a thicker resistive circuit pattern is desired, the rate at which the conductive ink is dispensed is increased. Conversely, in areas where a thinner resistive circuit pattern is desired, the rate at which the conductive ink is dispensed is reduced. Accordingly, a variable thickness resistive circuit pattern is produced by varying the rate at which the conductive ink is dispensed onto the target surface.

According to another method of the present invention, the rate at which the target surface is moved relative to the writing pen (i.e., feed speed) is varied in order to produce a variable thickness resistive circuit pattern. In areas where a thicker resistive circuit pattern is desired, the feed speed of the target surface is reduced relative to the writing pen while the rate at which the conductive ink is dispensed remains constant. Alternately, in areas where a thinner resistive circuit pattern is desired, the feed speed of the target surface is increased relative to the writing pen, again while the rate at which the conductive ink is dispensed remains constant. In yet another form of the present invention, both the dispensing rate of the conductive ink and the feed speed of the target surface may be varied in order to produce a variable thickness resistive circuit pattern. Both the dispensing rate and the feed speed may be varied either continuously or non-continuously to produce the continuous and non-continuous resistive circuit patterns as previously described while remaining within the scope of the present invention.

Figure 21:
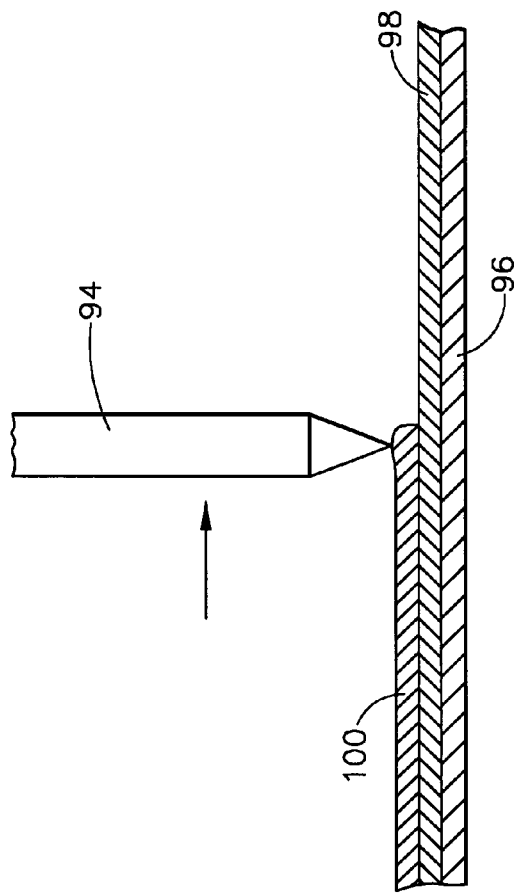
FIG. 21 is a cross-sectional view illustrating a method of forming a variable thickness resistive circuit pattern by overwriting a previously formed trace of the resistive circuit pattern in accordance with the principles of the present invention.

In yet another method as shown in FIG. 21, the present invention produces a variable thickness resistive circuit pattern by overwriting a volume of conductive ink on top of a previously formed trace of the resistive circuit pattern. More specifically, the method includes the steps of dispensing a volume of conductive ink from a pen 94 onto a surface 96 to form a trace 98 and then selectively dispensing an additional volume 100 of conductive ink onto the previously formed trace 98, wherein a variable thickness resistive circuit pattern is produced. Therefore, in areas where a thicker resistive circuit pattern is desired, an additional volume 100 of conductive ink is formed over a previously formed trace 98 in accordance with the principles of the present invention. Furthermore, either the pen 94 and/or the surface 96 are moved relative to one another during the dispensing of the conductive ink to form the desired resistive circuit pattern. Alternately, the volumes of conductive ink may be applied using process other than the precision pen writing equipment while remaining within the scope of the present invention. Other layering processes associated with thick film, thin film, thermal spraying, or sol-gel may be used to apply the volumes of conductive ink. For example, the thick film process of silk-screening may be employed to apply the volumes of conductive ink in one alternate form of the present invention. It should be understood that application of the additional volumes of conductive ink is not limited to a sequential application after the original volume is applied within a manufacturing process. More specifically, the additional volume may be applied at any stage of the manufacturing process such as, by way of example, after a drying operation or after a firing operation.

The description of the invention is merely exemplary in nature and, thus, variations that do not depart from the gist of the invention are intended to be within the scope of the invention. For example, the heater systems as described herein may be employed with a two-wire controller as shown and described in co-pending application Ser. No. 10/719327, titled "Two-Wire Layered Heater System," filed Nov. 21, 2003, and in co-pending applications titled "Combined Material Layering Technologies for Electric Heaters," and "Tailored Heat Transfer Layered Heater System," both filed Jan. 6, 2004, and all of which are commonly assigned with the present application and the contents of which are incorporated herein by reference in their entirety. Further, the cross-sectional profile of the resistive circuit pattern is not limited to rectangular shapes as illustrated herein. The leveling qualities of the ink may not produce such a shape after processing, and other shapes may be desired such as the variable thickness width through the racetrack portions as previously described and illustrated. Additionally, the resistive circuit patterns herein are illustrated on relatively flat and rectangular substrates for purposes of clarity, and it should be understood that other substrate geometries such as cylinders and other 3D shapes, such as those illustrated with the quartz heater embodiment, are within the scope of the present invention. Moreover, the circuits as illustrated herein are in series or in parallel, and it should be understood that the various embodiments of the present invention may also be employed with series-parallel circuits while remaining within the scope of the present invention. Such variations are not to be regarded as a departure from the spirit and scope of the invention.

What is claimed is:

1. A layered heater comprising:
   a dielectric layer;
   a resistive layer formed on the dielectric layer, the resistive layer comprising a resistive circuit pattern, the resistive circuit pattern defining a trace having a length, a thickness, and a spacing; and
   a protective layer formed on the resistive layer,
   wherein the thickness of the resistive circuit pattern varies along the length of the trace of the resistive circuit pattern for a variable watt density.

2. The layered heater according to claim 1, wherein the spacing is constant.

3. The layered heater according to claim 1, wherein the spacing is variable.

4. The layered heater according to claim 1, wherein the resistive circuit pattern further comprises a width that is constant.

5. The layered heater according to claim 1, wherein the resistive circuit pattern further comprises a width that is variable.

6. The layered heater according to claim 1, wherein the layered heater is selected from a group consisting of thick film, thin film, thermal spray, and sol-gel.

7. The layered heater according to claim 1, wherein the resistive circuit pattern is selected from a group consisting of series, parallel, and series-parallel.

8. The layered heater according to claim 1, wherein the variable thickness is continuous.

9. The layered heater according to claim 1, wherein the variable thickness is non-continuous.

10. A layered heater comprising:
    a dielectric layer;
    at least one resistive layer formed on the dielectric layer, the resistive layer comprising a resistive circuit pattern, the resistive circuit pattern defining a trace having a width and a spacing; and
    a protective layer formed on the at least one resistive layer,
    wherein a thickness of the resistive circuit pattern varies across the width of the trace of the resistive circuit pattern for a variable watt density.

11. A layered heater comprising:
    a substrate;
    a dielectric layer formed on the substrate;
    a resistive layer formed on the dielectric layer, the resistive layer comprising a resistive circuit pattern, the resistive circuit pattern defining a trace having a length and a thickness; and
    a protective layer formed on the resistive layer,
    wherein the thickness of the resistive circuit pattern varies along the length of the trace of the resistive circuit pattern for a variable watt density.

* * * * *